United States Patent [19]
Ribner

[11] Patent Number: 5,030,954
[45] Date of Patent: Jul. 9, 1991

[54] DOUBLE RATE OVERSAMPLED INTERPOLATIVE MODULATORS FOR ANALOG-TO-DIGITAL CONVERSION

[75] Inventor: David B. Ribner, Schenectady, N.Y.

[73] Assignee: General Electric Company, Schenectady, N.Y.

[21] Appl. No.: 583,746

[22] Filed: Sep. 17, 1990

[51] Int. Cl.$^5$ .............................................. H03M 3/02
[52] U.S. Cl. ..................................... 341/172; 341/143; 375/29; 375/33
[58] Field of Search ...................... 341/143, 155, 172; 375/26, 27, 28, 29, 33, 34

[56] References Cited

U.S. PATENT DOCUMENTS

| | | | |
|---|---|---|---|
| 4,574,250 | 3/1986 | Senderowicz | 341/143 |
| 4,633,223 | 12/1986 | Senderowicz | 341/172 |
| 4,633,425 | 12/1986 | Senderowicz | 341/143 |
| 4,857,928 | 8/1989 | Gailus et al. | 341/143 |
| 4,862,169 | 8/1989 | Van Bavel et al. | 341/143 |
| 4,876,542 | 10/1989 | Van Bavel et al. | 341/143 |
| 4,876,543 | 10/1989 | Van Bavel | 341/143 |
| 4,896,156 | 1/1990 | Garverick | 341/143 |
| 4,920,544 | 3/1990 | Endo et al. | 341/143 X |
| 4,939,516 | 7/1990 | Early | 341/143 |
| 4,972,436 | 11/1990 | Halim et al. | 375/28 |

OTHER PUBLICATIONS

J. C. Candy, "A Use of Double Integration in Sigma Delta Modulation", IEEE Transactions on Communications, vol. COM-3, No. 3, Mar. 1985, pp. 249–258.
J. C. Candy et al., "Using Triangularly Weighted Interpolation to Get 13-Bit PCM from a Sigma-Delta Modulator", IEEE Transactions on Communications, Nov. 1976, pp. 1268–1275.
J. C. Candy, "A Use of Limit Cycle Oscillations to Obtain Robust Analog-to-Digital Converters", IEEE Transactions on Communications, vol. COM-22, No. 3, Mar. 1974, pp. 298–305.
R. Gregorian et al., "Analog MOS Integrated Circuits for Signal Processing", Wiley, New York (1986), pp. 500–504.
T. C. Choi et al., "Considerations for High-Frequency Switched-Capacitor Ladder Filters", IEEE Transactions on Circuits and Systems, vol. CAS-27, No. 6, Jun. 1989, pp. 545–552.

Primary Examiner—A. D. Pellinen
Assistant Examiner—Howard L. Williams
Attorney, Agent, or Firm—Marvin Snyder; James C. Davis, Jr.

[57] ABSTRACT

A circuit transformation that doubles the effective sampling rate of any switched capacitor oversampled, interpolative modulator, regardless of its order, employs, in each integrator of the modulator, a second input capacitor and switches that operate on alternate clock phases. In addition, two quantizers, instead of one, are employed in the network and are operated on opposite clock phases. Alternatively, the quantizers can be operated at twice the normal rate if feasible for the particular circuit. The effective operating rate is thereby doubled without any increase in clock rate or circuit speed requirements, resulting in improved analog-to-digital resolution or conversion rate.

24 Claims, 10 Drawing Sheets $$\phi_{DACP1} = \phi_{13} \cdot (CMP1 \oplus \phi_{CHN})$$

$$\phi_{DACN1} = \phi_{13} \cdot (\overline{CMP1} \oplus \phi_{CHN})$$

$$\phi_{DACP2} = \phi_{13} \cdot CMP1$$

$$\phi_{DACN2} = \phi_{13} \cdot \overline{CMP1}$$

$$\phi_{DACP3} = \phi_{13} \cdot CMP2$$

$$\phi_{DACN3} = \phi_{13} \cdot \overline{CMP2}$$

$$\phi_{INP} = \phi_{24} \cdot \phi_{CHP}$$

$$\phi_{INN} = \phi_{24} \cdot \phi_{CHN}$$

DOUBLE RATE OVERSAMPLED INTERPOLATIVE MODULATORS FOR ANALOG-TO-DIGITAL CONVERSION

CROSS-REFERENCE TO RELATED APPLICATION

This application is related in subject matter to the copending U.S. patent application Ser. No. 07/505,384 of David B. Ribner entitled "Third Order Sigma Delta Oversampled Analog-to-Digital Converter Network with Low Component Sensitivity" filed Apr. 6, 1990, and assigned to the assignee of this application. The subject matter thereof is hereby incorporated by reference.

BACKGROUND OF THE INVENTION

1. Field of the Invention

This invention relates to oversampled analog-to-digital converters and, more particularly, to a technique for doubling the effective operating rate of an oversampled modulator to realize an increase in performance either in the form of an increase in resolution or an increase in conversion rate, without any reduction in resolution of oversampled analog-to-digital converters. The principles of the invention are generally applicable to any oversampled network, including second- and third-order oversampled modulators.

2. General Description of the Prior Art

High resolution analog-to-digital signal conversion can be achieved with lower resolution components through the use of an oversampled interpolative (or sigma delta) modulator followed by a digital low pass decimation filter. Oversampling constitutes operation of the modulator at a rate many times above the signal Nyquist rate, whereas decimation constitutes reduction of the clock rate down to the Nyquist rate.

Sigma delta modulators (sometimes referred to as delta sigma modulators) have been used in analog-to-digital (A/D) converters for some time. Detailed general information can be obtained from the following technical articles which are hereby incorporated by reference.

(1) "A Use of Limit Cycle Oscillators to Obtain Robust Analog to Digital Converters", J. C. Candy, *IEEE Transactions on Communications*, Vol. COM-22, No. 3, pp. 298-305, March 1974

(2) "Using Triangularly Weighted Interpolation to Get 13-Bit PCM from a Sigma-Delta Modulator", J. C. Candy et al., *IEEE Transactions on Communications*, Vol. COM-24, No. 11, pp. 1268-1275, November 1976

(3) "A Use of Double Integration in Sigma Delta Modulator", J. C. Candy, *IEEE Transactions on Communication*, Vol. COM-33, No. 3, pp. 249-258, March 1985

Oversampled analog-to-digital converters perform a coarse quantization of their input signal at a sampling rate that is much higher than the Nyquist rate. Using a combination of feedback and integration, the resulting quantization noise is forced to high frequency so that its removal can be effected by low pass filtering and decimation. Enhanced resolution is obtained after these operations, but only at the expense of a reduction in throughput from the initial conversion rate. This type of converter offers the flexibility of allowing a tradeoff between resolution in time and resolution in amplitude. As an example, it is possible to achieve 16-bit conversions starting with only a 1-bit quantizer.

The ratio of the initial to final conversion rates, referred to as the oversampling ratio, governs the increase in resolution that is obtained for a given design of oversampled analog-to-digital converter (ADC). For a second-order modulator design, for instance, resolution improves by 2.5 bits for each doubling of the oversampling ratio, and increases to 3.5 bits for a third-order modulator. It would be desirable to operate with as high an oversampling ratio as possible; however, for a specified final conversion rate, circuit speed will impose a limitation on any given technology. A method that doubles the sampling ratio without increasing the circuit speed requirements would be useful in offering either improved resolution, e.g., 3.5 bits for a third-order modulator, or a doubling of the conversion rate without any reduction in resolution for higher frequency applications.

SUMMARY OF THE INVENTION

It is therefore an object of the present invention to double the effective operating rate of any oversampled modulator, without any increase in clock rate or circuit speed requirements, in order to improve ADC resolution or conversion rate.

The invention contemplates a circuit transformation applicable to any switched capacitor (SC) oversampled modulator, regardless of its order, that doubles its effective sampling rate. The circuit transformation consists of adding a second input capacitor and switches to each integrator operating on alternate clock phases. The switches employed in the circuitry are typically field effect transistor (FET) switches. In addition, each quantizer in the network is replaced by two quantizers, again operated on opposite clock phases. Alternatively, the quantizers can be simply operated at twice the normal rate if feasible for the particular circuit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Figure 1:
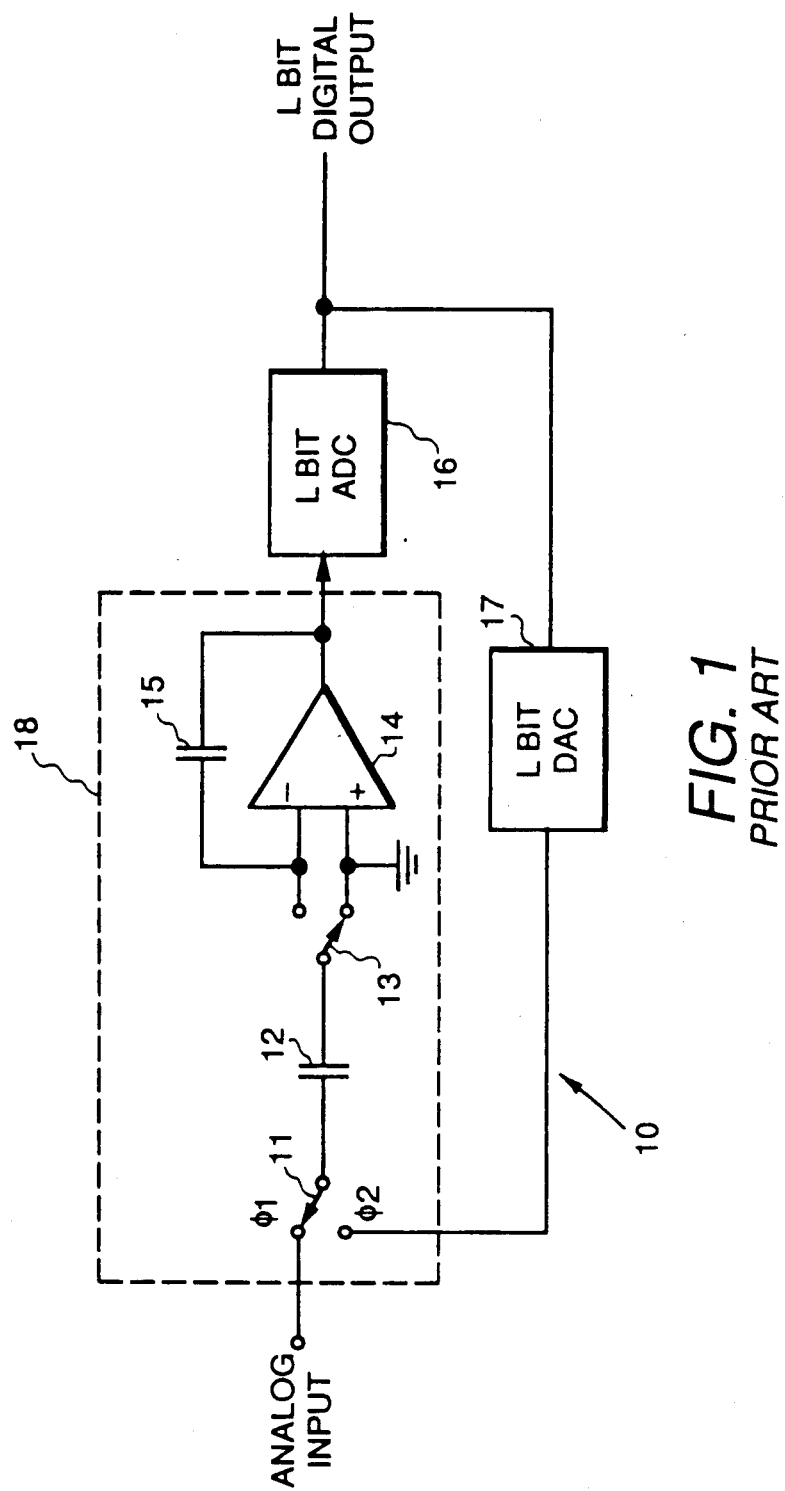
FIG. 1 is a schematic diagram of a first-order oversampled modulator.

FIG. 1 shows a simple first-order modulator 10 that switches alternately between clock phases $\phi_1$ and $\phi_2$, using two phase-nonoverlapping clocks. The modulator comprises a stray-free switched capacitor integrator 18 along with an analog-to-digital converter (ADC) 16 and a digital-to-analog converter (DAC) 17.

During clock phase $\phi_1$, the modulator analog input signal $V_i$ is sampled by an input capacitor 12 as a switch 11 is connected to the input and switch 13 is connected to ground. Also during this clock phase, an operational amplifier 14, acting as a sample and hold circuit due to a feedback capacitor 15 of capacitance $C_f$, provides a constant signal for ADC 16 to convert to a digital format. The output signal of ADC 16 is supplied to the digital input of DAC 17 so as to provide a quantized analog signal as a feedback signal to integrator 18.

On the subsequent clock phase $\phi_2$, switches 11 and 13 alternate to connect input capacitor 12 between the output of DAC 17 and the inverting input of operational amplifier 14. This causes a charge equal to the difference between the input voltage and the DAC output voltage $V_{DAC}$ times the value of the input capacitance $C_i$ to be injected into the operation amplifier feedback capacitor 15. As a result, the operational amplifier output voltage $V_o$ changes in the discrete time domain according to the following equation:

$$V_o(nT) = V_o[(n-1)T] + \frac{C_i}{C_f}[V_i[(n-1)T] - V_{DAC}[(n-1)T]],$$

where n represents the discrete time instant nT (T being the sampling period of the two phase clocks). Taking the Z transform of the above equation results in the following equation:

$$V_o(Z) = \frac{C_i}{C_f} Z^{-1} \frac{V_i(Z) - V_{DAC}(Z)}{(1 - Z^{-1})},$$

Z the discrete time frequency variable. The integrator in this configuration therefore integrates the difference of the analog input signal and the DAC output signal in the feedback loop.

At low frequencies, the gain of the integrator is very high so that the output signal of the modulator approximates the input signal of the loop with little error. Furthermore, quantization noise introduced by ADC 16 is attenuated by the loop gain and is thereby attenuated at low frequency and becomes prominent at frequencies where the loop gain is low. The output of ADC 16 is connected to a digital lowpass filter and a decimator (not shown) to attenuate high frequency quantization noise and produce a high resolution digital output signal.

Figure 2:
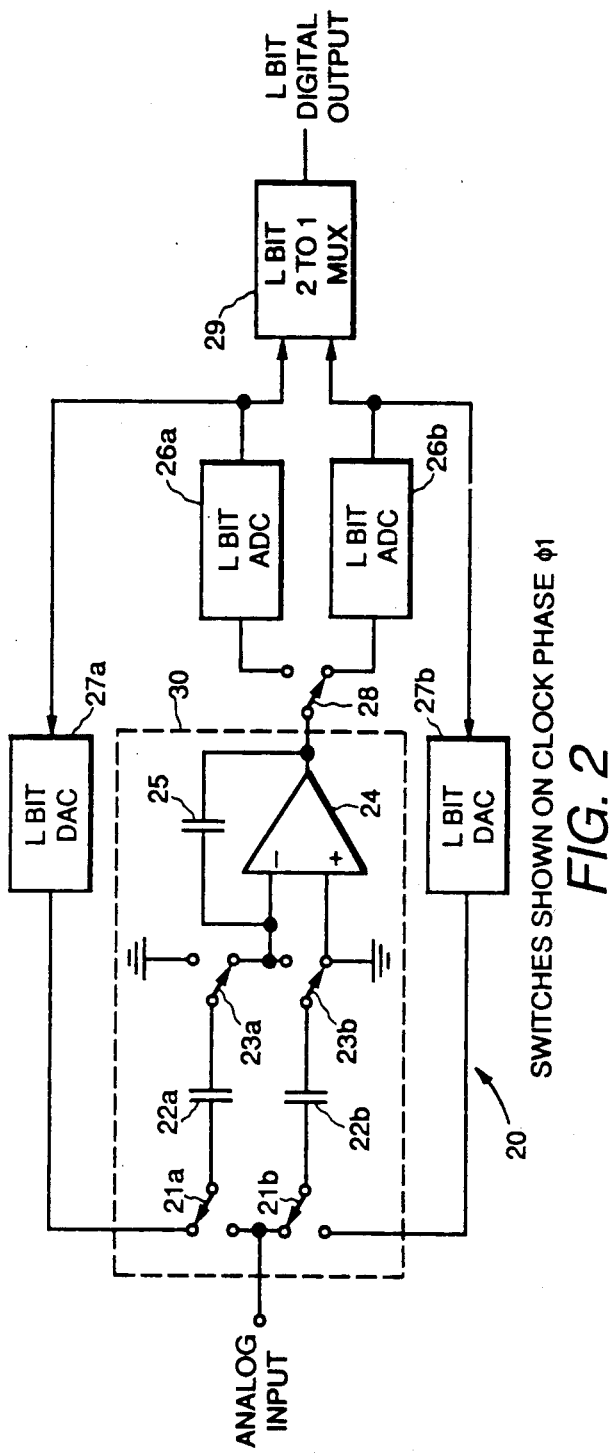
FIG. 2 is a schematic diagram of a double-rate oversampled m according to the invention.
Figure 3:
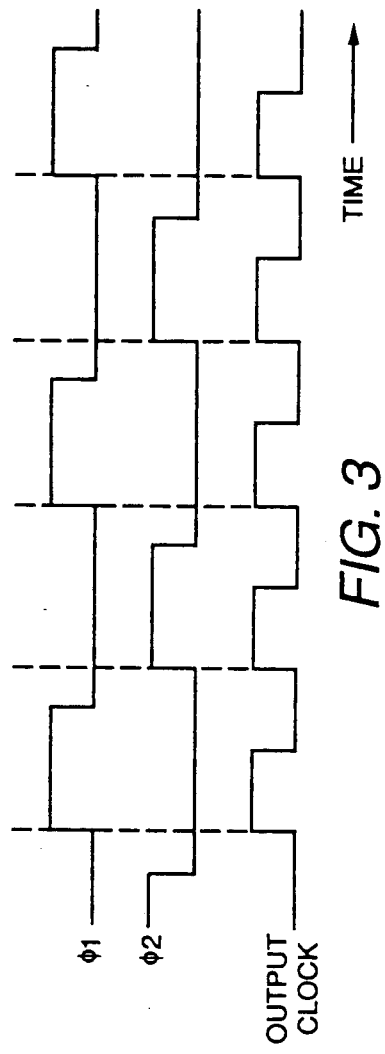
FIG. 3 is a timing diagram showing the clock waveforms for operating the switches in the double-rate oversampled modulator shown in FIG. 2.

The new double-rate oversampled modulator 20 according to the invention is shown in FIG. 2 and the switch timing clock phases are shown in FIG. 3. The invention applies, for the first time, high frequency switched capacitor techniques to oversampled modulators. Such techniques have been used in ladder filters as described by Tat C. Choi and Robert W. Bordersen in "Considerations for High-Frequency Switched-Capacitor Ladder Filters", *IEEE Trans on Circuits and Systems*, Vol. CAS-27, No. 6, June 1980, pp. 545–552. The technique used in the present invention permits the sample rate to be twice the clock rate.

Referring now to FIG. 2, a switched capacitor integrator 30 comprises two input switches 21a and 21b connected to alternately sample the analog input voltage during clock phases $\phi_1$ and $\phi_2$, respectively. However, there is a nonoverlapping of the sampling of the analog input signal, as indicated by the time spacing between the $\phi_1$ and $\phi_2$ clocks in FIG. 3. This avoids any overlap of the connection of input capacitors 22a and 22b by switches 23a and 23b, respectively, to the inverting input of an operational amplifier 24. Thus, while a feedback capacitor 25 is being charged by one of the input capacitors, the other input capacitor is sampling the input voltage. A switch 28 is connected to the output of integrator 30 to alternately connect the output at the clock rate to L-bit individual ADC and DAC. The outputs of the L-bit ADCs 26a and 26b are connected to an L-bit 2-to-1 multiplexer 29 which provides the L-bit digital output. The L-bit output signals of ADCs 26a and 26b are respectively supplied to L-bit DACs 27a and 27b which, in turn, generate analog feedback voltages to the sampling switches 21a and 21b.

Operation at twice the original speed is achieved by the action of the second set of capacitors and switches, allowing integrator 30 to update its output signal on both clock phases In addition, the dual ADCs 26a, 26b and dual DACs 27a, 27b facilitate quantization to be carried out on both clock phases. Matching of the two quantizers is not critical, although each DAC 27a and 27b must have an accuracy comparable with the required resolution of the oversampled system after decimation and filtering. When this is the case, relative gain and offset errors of the two DACs average together to determine the overall gain and offset after decimation. Also, in a preferred embodiment, one bit ADCs and DACs are used, due to their inherent linearity.

Figure 4:
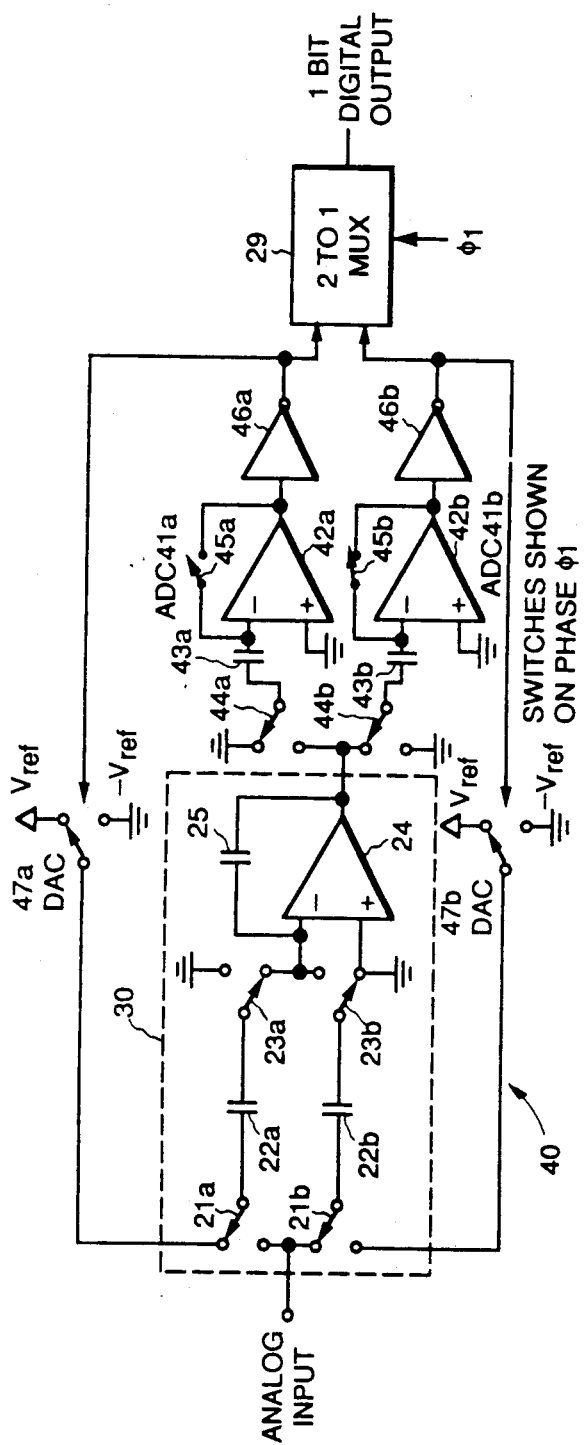
FIG. 4 is a schematic diagram of a first-order oversampled double-rate modulator according to the invention.
Figure 5:
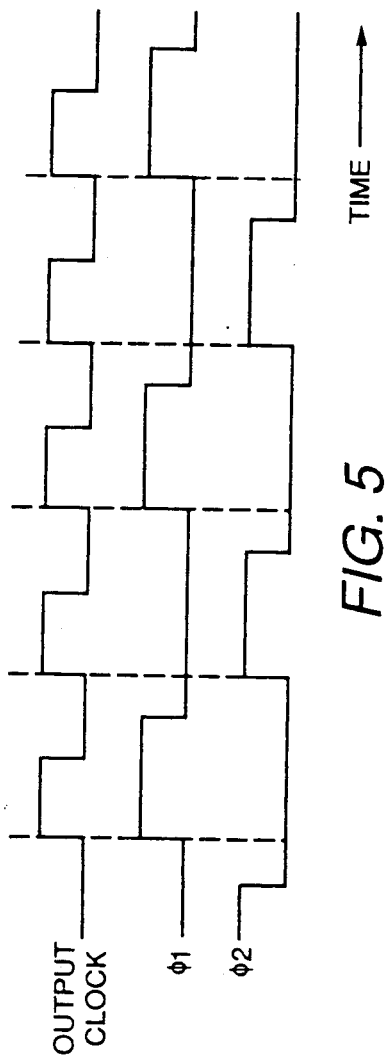
FIG. 5 is a timing diagram showing the clock waveforms for operating the switches in the modulator shown in FIG. 4.

A specific implementation of the double-rate technique applied to a first-order oversampled modulator 40 is shown in FIG. 4 for the case of a one-bit quantizer, and the associated clock waveforms are shown in FIG. 5. Elements which are identical to those of FIG. 2 are identified by the same reference numerals in FIG. 4. The one-bit ADCs 41a and 41b respectively comprise operational amplifiers 42a and 42b having input capacitors 43a and 43b alternately connected to the output of operational amplifier 24 and ground by switches 44a and 44b, respectively. Feedback loops between the outputs and the negative inputs of operational amplifiers 42a and 42b are provided with switches 45a and 45b which are alternately opened and closed. Thus, the ADCs 41a and 41b comprise autozeroed comparators. The outputs of the operational amplifiers 42a and 42b are connected by respective inverting amplifiers 46a and 46b to multiplexer 29 and to respective DACs 47a and 47b. Each of DACs 47a and 47b is just a singlepole, double-throw (SPDT) switch that connects to either the reference voltage $V_{ref}$ or to $-V_{ref}$.

The two-phase switching sequence of the auto-zeroed comparators adds a one-half cycle delay to the feedback loops that is necessary for stable operation of the modulator. The two-level DACs 47a and 47b are advantageous since mismatch in their levels can only introduce an offset error and cannot add any nonlinearity. Offset can usually be tolerated and often calibrated out; however, nonlinearity is a severe problem to overcome once introduced. Those skilled in the art will recognize that a dither signal is needed for the case of a first-order modulator, but this detail is not indicated in FIGS. 1 or 4.

Figure 6:
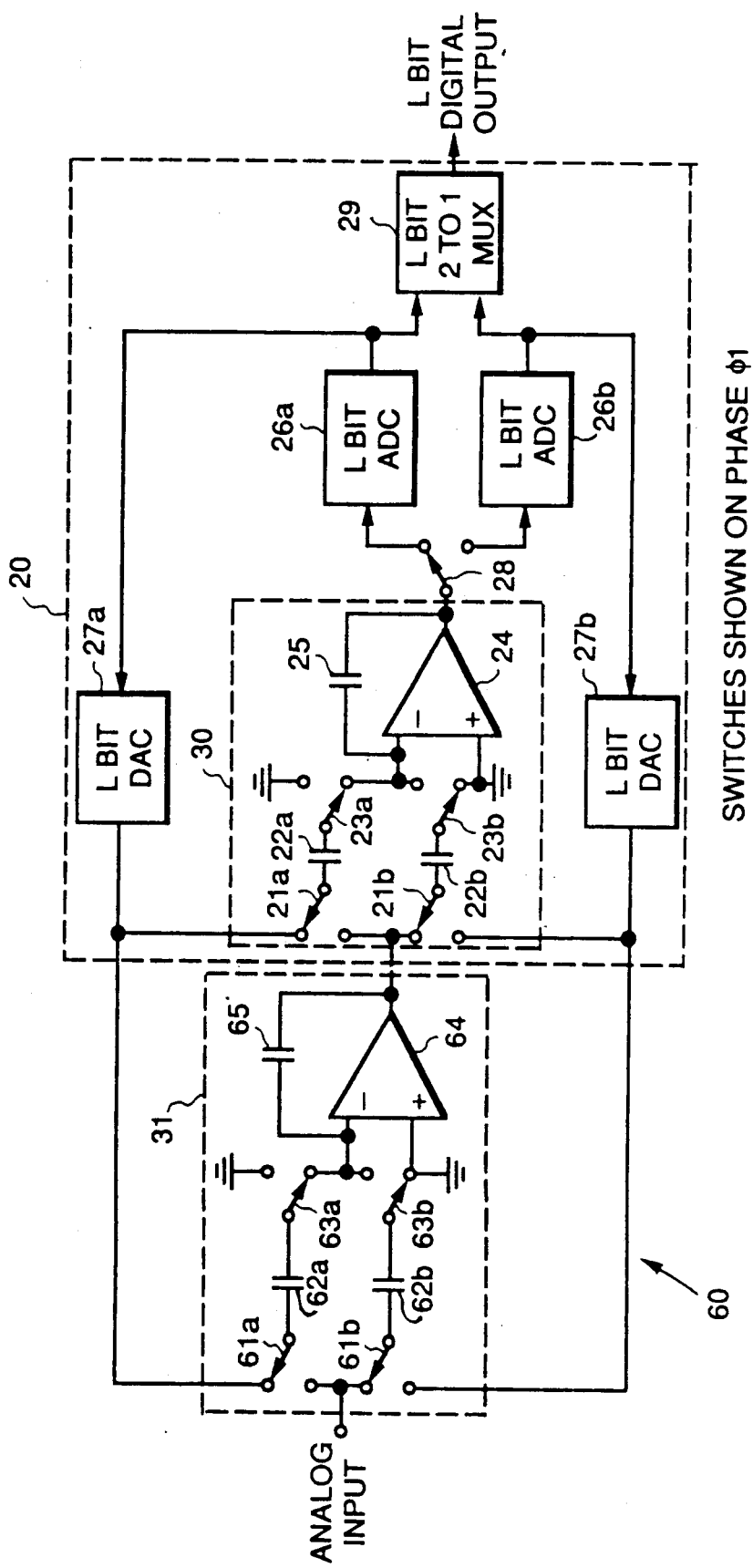
FIG. 6 is a schematic diagram of a double-rate second-order oversampled modulator according to the invention.
Figure 7:
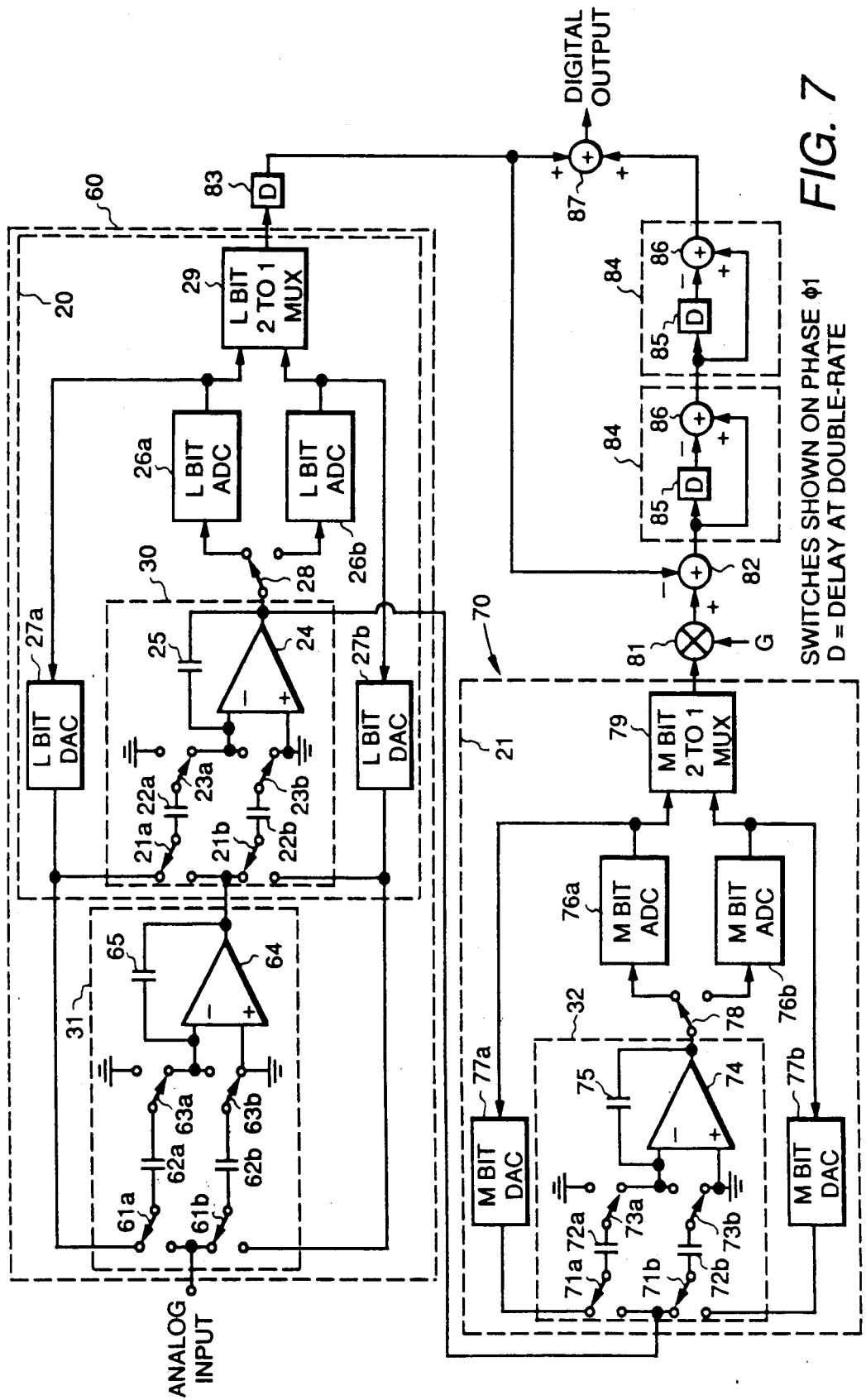
FIG. 7 is a schematic diagram of a double-rate third-order oversampled modulator according to the invention.

To demonstrate that this double-rate circuit technique is applicable to virtually any oversampled network, second and third-order implementations are shown in FIGS. 6 and 7, respectively.

FIG. 6 shows a double-rate second-order oversampled modulator 60 which incorporates the modulator 20 of FIG. 2 preceded by an additional double-rate integrator 31 substantially identical to integrator 30. The input to second-order modulator 60 is via switches 61a and 61b of integrator 31 which alternately sample the input analog voltage and the output signal of the L-bit DACs 27a and 27b, respectively. The sampled analog voltage charges input capacitors 62a and 62b when the capacitors are connected to ground via switches 63a and 63b, respectively. Alternately, the capacitors are connected to the inverting input of a second operational amplifier 64. The output of operational amplifier 64 is alternately sampled by switches 21a and 21b.

The aforementioned application Ser. No. 07/505,384 is directed to a third-order oversampled modulator. FIG. 7 shows a modification of that modulator to form a double-rate third-order oversampled modulator 70. This modulator incorporates the structure of double-rate second-order modulator 60 of FIG. 6 with the addition of a double-rate first-order modulator 21 substantially identical to modulator 20 of FIG. 2, and therefore like reference numerals identify identical elements in the two figures. In FIG. 7, modulator 21 includes a switched capacitor integrator 32 having switches 71a and 71b which alternately sample the output signal of integrator 30, and the sampled output signal is alternately applied to the inverting input of a third operational amplifier 74. The output signal of integrator 32 is supplied via a switch 78 to M-bit ADCs 76a and 76b, the output signals of which are supplied to an M-bit 2-to-1 multiplexer 79. The output signals of M-bit ADCs 76a and 76b are also supplied to corresponding M-bit DACs 77a and 77b, the outputs of which are alternately connected to input capacitors 72a and 72b by switches 71a and 71b, respectively. Switches 73a and 73b function analogously to switches 23a and 23b, respectively, in modulator 20 of FIG. 2.

The output signal of M-bit multiplexer 79 is multiplied by a gain factor G in a digital multiplier 81. The output signal of multiplier 81 is supplied to a digital subtractor 82. The output signal of L-bit multiplexer 29 is delayed one cycle by a delay register 83, and the output signal of this register is supplied to the subtrahend input of digital subtractor 82. The difference output signal of digital subtractor 82 is supplied to a pair of cascaded digital differentiators 84, each comprised of a one-cycle delay register 85 and a digital subtractor 86. Finally, the output signals of delay register 83 and the second of cascaded differentiators 84 are summed in a digital adder 87 to produce the digital output signal of modulator 70.

The circuit elements 81 to 87 comprise a digital canceler. That is, the difference between the two digital output signals from modulators 60 and 21 is exactly equal to minus the quantization noise of second-order modulator 60. A double differentiated signal from cascaded differentiators 84 is added to the digital output signal of second-order modulator 60 to effect the cancellation of the quantization noise of modulator 60. A more detailed description of this canceler is set forth in the aforementioned Ribner application Ser. No. 07/505,384 filed Apr. 6, 1990. This is but one form of digital canceler and other implementations are possible.

Figure 8:
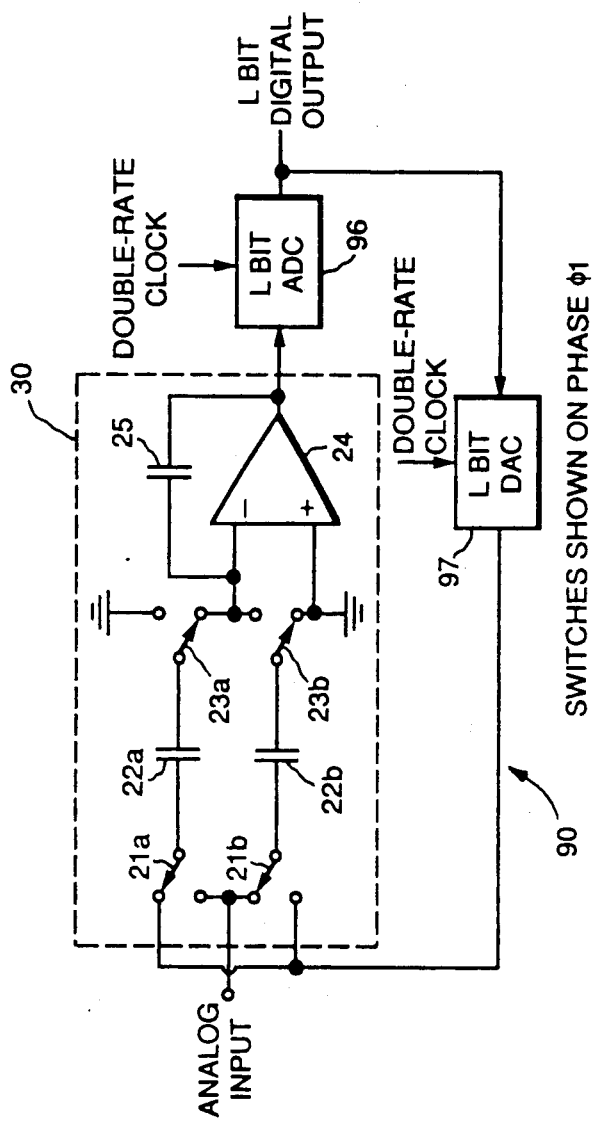
FIG. 8 is a schematic diagram of a double-rate oversampled modulator using a single double-rate analog-to-digital converter and a single double-rate digital-to-analog converter.
Figure 9:
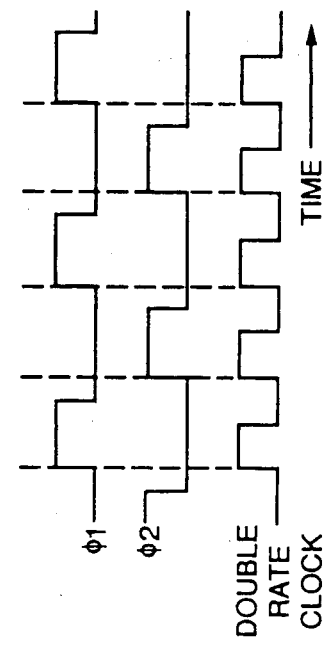
FIG. 9 is a timing diagram showing the clock waveforms for the modulator shown in FIG. 8.

In both FIGS. 6 and 7, L-bit quantizers are shown for generality; however, it will be understood by those skilled in the art that for the case L=1 (i.e., 1-bit quantization), the auto-zeroed comparator circuit and single-pole double-throw switch scheme shown in FIG. 4 would be substituted for each ADC and DAC combination as shown in FIGS. 6 and 7. Also in FIG. 7, M-bit ADCs 76a, 76b and M-bit DACs 77a, 77b are employed in the event a different number of bits (or a different quantization level) is used in each of the two cascaded modulators 60 and 70.

Where sufficiently fast quantizers (i.e., ADC and DAC combination) are available, then double-rate operation can be achieved as illustrated in FIG. 8 which shows, by way of example, a first-order double-rate oversampled modulator 90. This modulator is similar to that shown in FIG. 2, except for the use of a double-rate L-bit ADC 96 and a double-rate L-bit DAC 97. Use of the double-rate L-bit ADC eliminates need for the 2-to-1 multiplexer employed in the modulator of FIG. 2, the L-bit digital output signal being taken directly from L-bit ADC 96. The clock waveforms for the modulator shown in FIG. 8 are shown in FIG. 9. Since ADC 96 and the DAC 97 are operated at double rate, they perform conversions on both clock phases.

Figure 10:
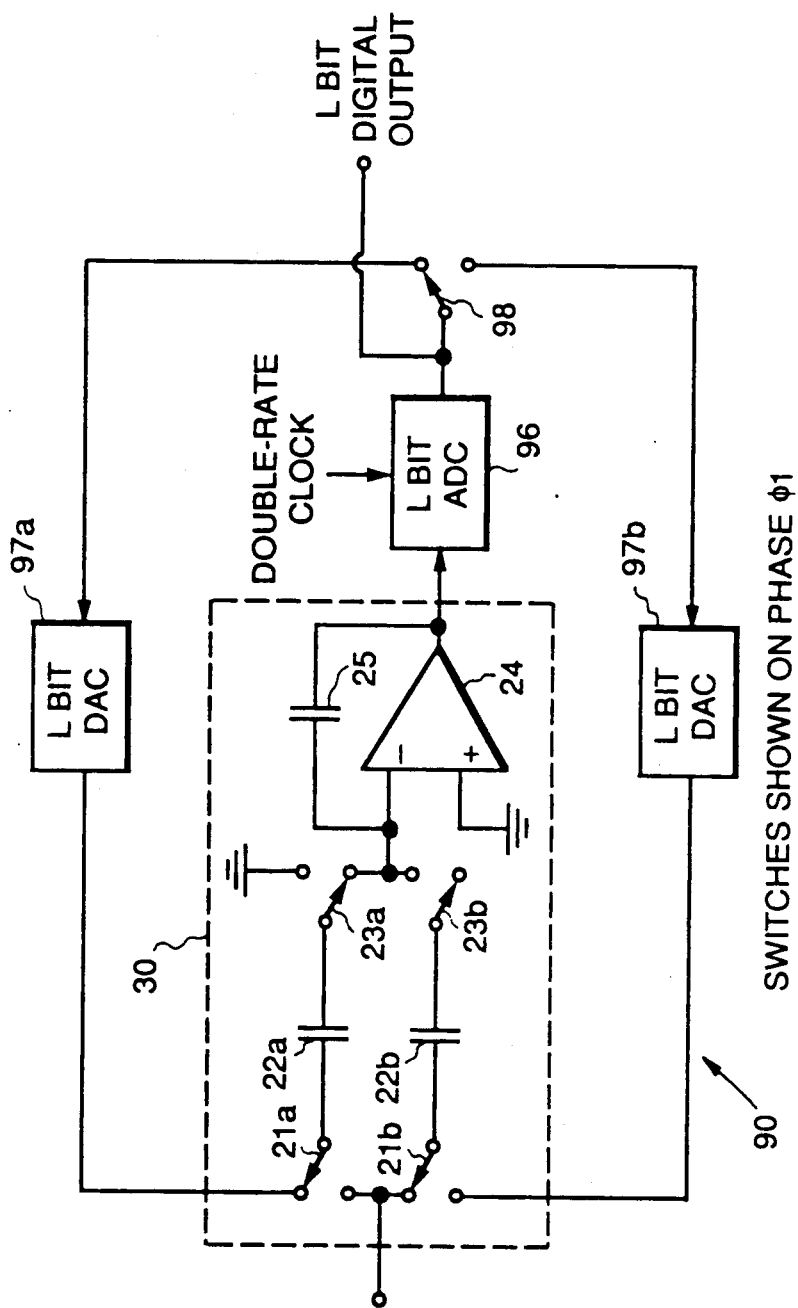
FIG. 10 is a schematic diagram of a double-rate oversampled modulator using a single double-rate analog-to-digital converter but two digital-to-analog converters.

A further variation is introduced in FIG. 10 for situations where the ADC is faster than the available DAC. In this embodiment, a double-rate ADC 96 is used, but a pair of single-rate DACs 97a and 97b are employed in the feedback loops. A multiplexer, illustrated as a switch 98, alternately couples the output of ADC 96 to DACs 97a and 97b. It will be understood that operation of the modulator circuit shown in FIG. 10 is essentially similar to operation of the modulator shown in FIG. 2. Also, it will be understood that either of the approaches of FIGS. 8 and 10 can be incorporated in the context of the modulator networks of FIGS. 6 and 7.

Although the modulator components, i.e., the integrators, ADCs and DACs, have so far been illustrated with single-ended outputs, the third-order sigma delta analog-to-digital converter of this invention has been implemented by employing a differential signal path using integrators with differential outputs for improved rejection of power supply noise. This implementation is shown in FIG. 11.

Figure 11A:
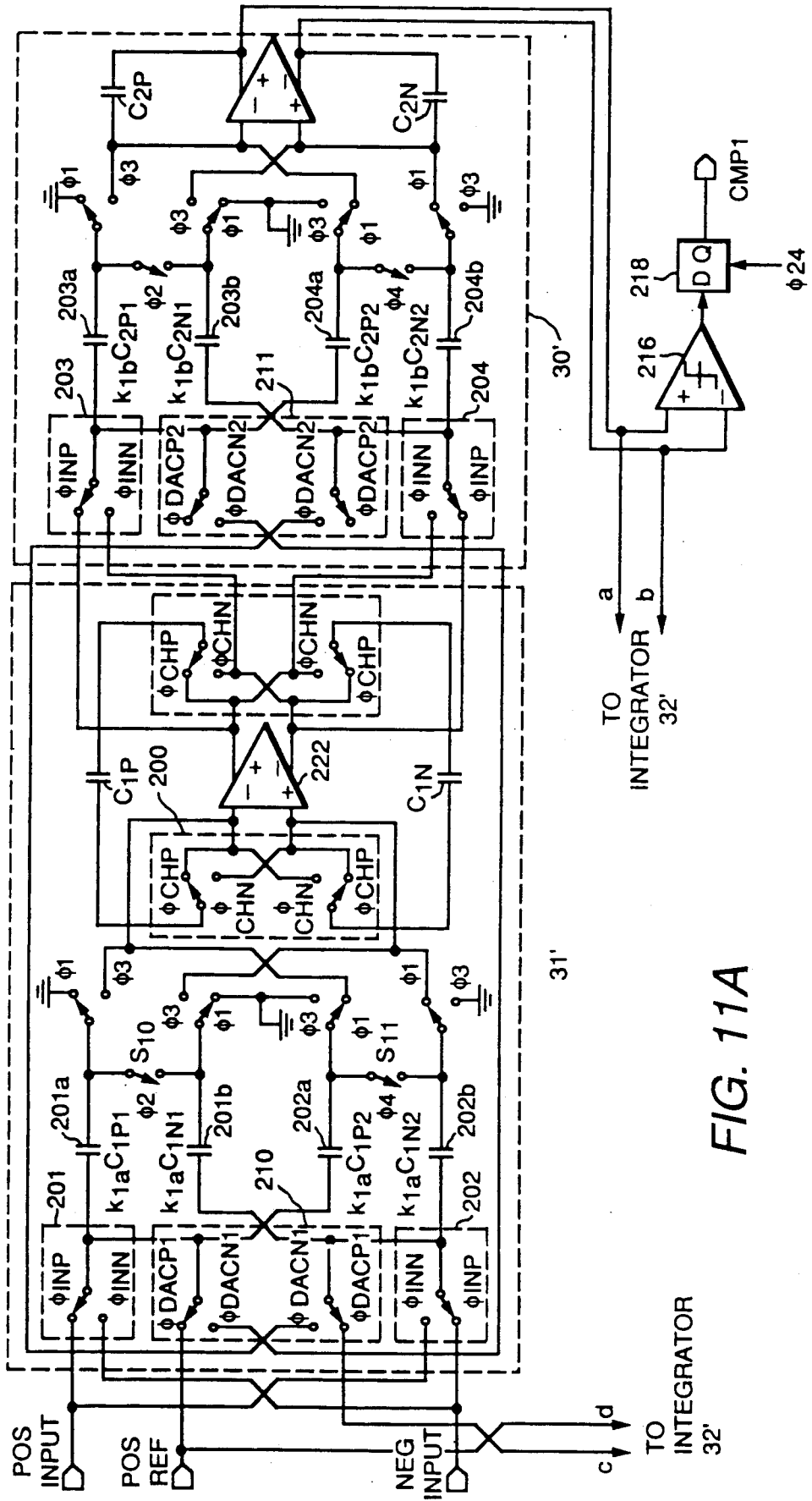
FIG. 11A and 11B are a schematic diagram of a double-rate third-order modulator using differential amplifiers with chopper stabilization for the first stage.
Figure 11B:
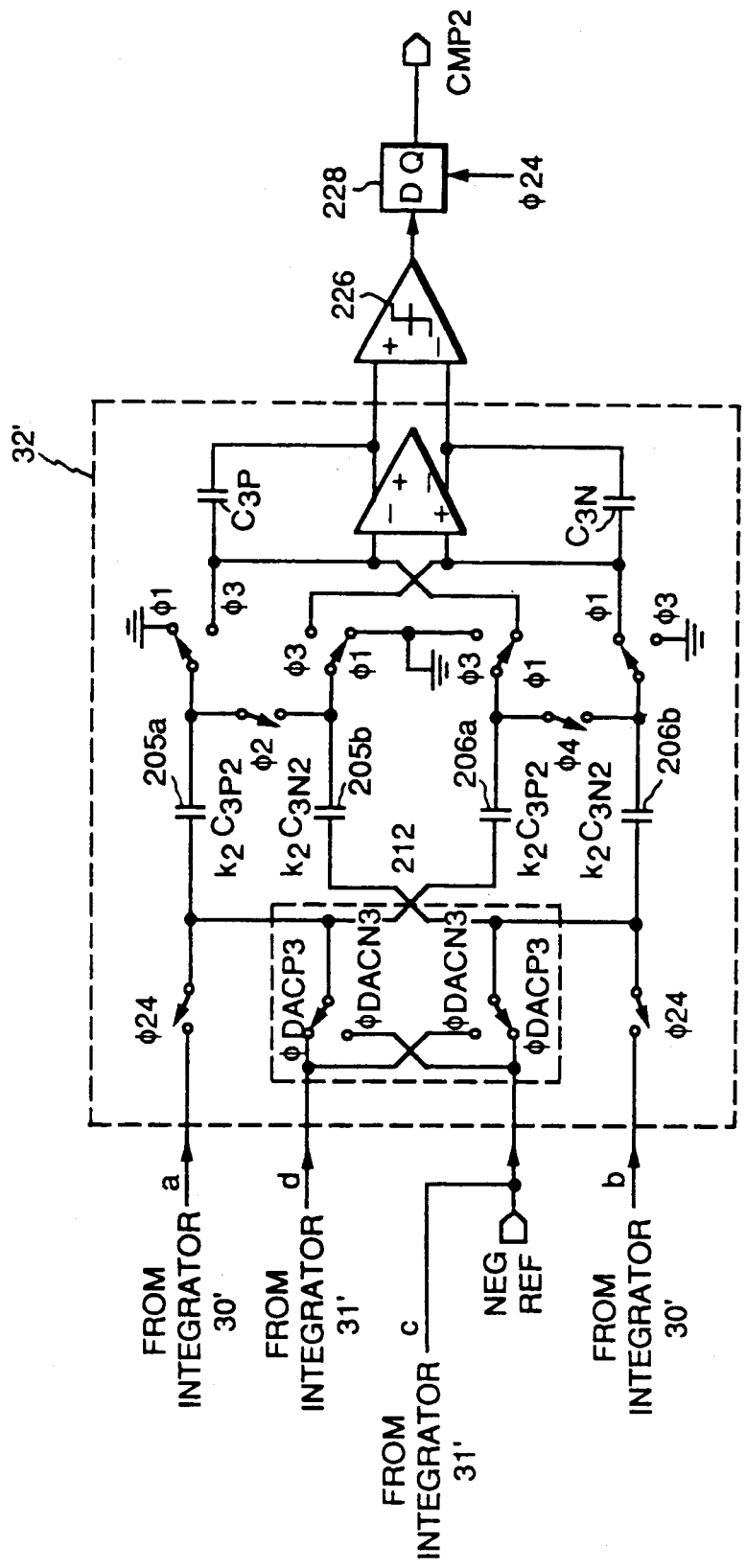
Figure 12:
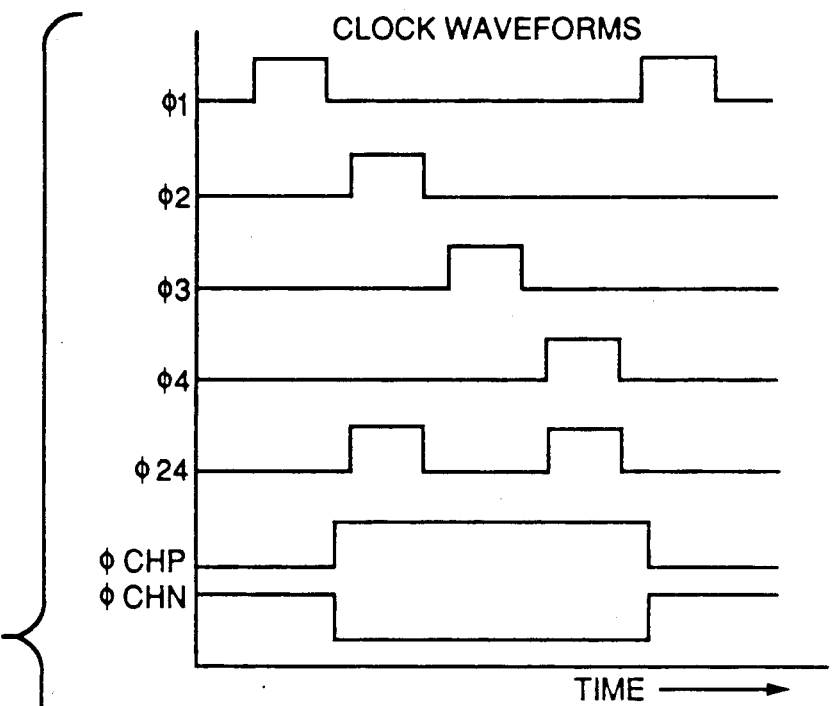
FIG. 12 is a timing diagram showing the clock waveforms for operating the switches in the modulator shown in FIG. 11A and 11B.

The network of FIGS. 11A and 11B employs differential amplifiers in a manner representative of the circuitry used in a third-order sigma delta oversampled A/D converter network test chip, while FIG. 12 illustrates the clock waveforms employed in the circuit of FIG. 11A and 11B. The circuit of FIGS. 11A and 11B differ from the single-ended switched-capacitor A/D converter network shown in FIG. 7 in that (1) it uses four-phase instead of two-phase clocking, (2) it makes use of a fully-balanced (or differential) signal path for better rejection of spurious power supply noise and common mode signals, (3) it employs a chopper stabilization circuit for suppression of low frequency operational amplifier noise, (4) it can be operated as a single-ended input circuit even though it is a differential circuit, and (5) it uses double-speed ADCs and single-rate DACs, as in the circuit of FIG. 10. Integrators 30', 31' and 32' employed in the circuit of FIGS. 11A and 11B correspond to integrators 30, 31, and 32, respectively, in the circuit of FIG. 7 but include balanced outputs and balanced inputs. In addition, although not shown in FIGS. 11A and 11B, it will be understood that a digital canceler, corresponding to circuit elements 81 to 87 interconnected as shown in FIG. 7, is also provided. The circuit shown in FIGS. 11A and 11B represents the circuitry implemented on an integrated circuit chip.

In considering operation of the circuit of FIGS, 11A and 11B the presence of a chopper 200 as part of integrator 31' will be ignored initially by assuming chopper phase $\phi_{CHP}$ is always asserted. A balanced input signal is also assumed. In these circumstances, operation is similar to that of the single-ended circuit of FIG. 7; however, the precise phase assignment for sampling and integration is different. The balanced circuit integrates on clock phases $\phi_1$ and $\phi_3$ and samples during clock phases $\phi_2$ and $\phi_4$, whereas the circuit of FIG. 7 performs sampling and integration on both of its clock phases. Operation is similar to that described for the circuit of FIG. 7 except that when the input signal is alternately sampled during phases $\phi_2$ and $\phi_4$ by one of two balanced input pairs of capacitors 201a, 201b and 202a, 202b, the output sides of capacitors 201a and 201b are connected together through switch $S_{10}$ during phase $\phi_2$ and similarly, the output sides of capacitors 202a and 202b are connected together through switch S11 during phase $\phi_4$, instead of to ground. This connection is made so that only the differential component of the input signal is acquired. A common mode signal, if present, would also be sampled if capacitor pairs 201a, 201b and 202a, 202b were switched to ground instead of to each other; however, in the configuration shown, the charge stored on input capacitor difference between the two input signals, not on their average value. Similar effects occur with regard to input capacitor pairs 203a, 203b and 204a, 204b for the second stage integrator 30' of the network and input capacitor pairs 205a, 205b and 206a, 206b for the third stage integrator 32 of the network.

As just described, the output sides of the input capacitor pairs for each of the integrator stages would never be connected to a voltage source or ground, and hence the voltages on each of these capacitors would be arbitrary. Similarly, the voltage level at the input to the operational amplifier receiving a signal from its input capacitors would be undefined. Therefore, to establish the potential at the output (or right-hand) side of the input capacitors, a connection to ground during phases $\phi_1$ and $\phi_3$ is employed while the input (or left-hand) side of each input capacitor remains connected to the positive and negative reference signals.

Another minor difference from the circuit of FIG. 7 is that one-bit DACs 210, 211 and 212 are implemented directly at the input (or left-hand) sides of the input capacitor pairs 201a, 201b and 202a, 202b of integrator 31, 203a, 203b and 204a, 204b of integrator 30' and 205a, 205b and 206a, 206b, of integrator 32', respectively, instead of by employing L-bit DACs as shown in the network of FIG. 6.

The logic for the individual switch positions in DACs 210, 211 and 212, expressed in Boolean algebra, is as follows:

$$\phi_{DACP1} = \phi_{13} \cdot (CMP1 \oplus \phi_{CHN})$$

$$\phi_{DACN1} = \phi_{13} \cdot (CMP1 \oplus \phi_{CHN})$$

$$\phi_{DACP2} = \phi_{13} \cdot CMP1$$

$$\phi_{DACN2} = \phi_{13} \cdot CMP1$$

$$\phi_{DACP3} = \phi_{13} \cdot CMP2$$

$$\phi_{DACN3} = \phi_{13} \cdot CMP2$$

where CMP1 and CMP2 are the output signals from a comparator 216 at the output of second stage integrator 30', as latched by a latch circuit 218, and the output signals from a comparator 226 at the output of third stage integrator 32', as latched by a latch circuit 228, respectively. Clock waveforms for the circuit are shown in FIG. 12.

In considering the role of the chopper, the MOS (metal oxide semiconductor) switching devices represented by double-pole, double-throw (DPDT) chopper switches 200 on either side of a first operational amplifier 222 perform a periodic reversal of signal polarities at the input and output of the operational amplifier as controlled by the $\phi_{CHP}$ and $\phi_{CHN}$ chopper clock signals. Clocks $\phi_{CHP}$ and $\phi_{CHN}$, illustrated in the waveform drawings of FIG. 12, may alternate at any rate that is an integral multiple of the output conversion rate, up to a maximum rate of the modulator frequency. When clock $\phi_{CHP}$ is high, a noninverting path through operational amplifier 222 is selected by the chopper at both input and output, while when phase $\phi_{CHN}$ is high, an inverting configuration is produced. Since inversion takes place simultaneously at both the input and output of the operational amplifier whenever clock $\phi_{CHN}$ is high, there is no effect on signals traversing the integrator. However, noise from the operational amplifier itself goes through only the output switches of the chopper and, as such, alternates in polarity at a rate determined by the frequency of the chopper clocks. This is equivalent to multiplying the noise by a periodic square wave signal with an amplitude of $\pm 1$, which amounts to a modulation of the operational amplifier noise up to the frequency of the chopper square wave and all of its harmonics. As a result, the severe low frequency flicker (or 1/f) noise is moved out of the baseband frequency of the modulator. Flicker noise is discussed in R. Gregorian, "Analog MOS Integrated Circuits for Signal Processing", Wiley, N.Y. (1986), at pages 500–505, and the discussion therein is hereby incorporated by reference. Subsequent digital filtering by a digital decimation filter (not shown in FIG. 11) removes the modulated 1/f noise. In fact, chopping at a rate equal to the output rate of the decimation filter, or a higher integral multiple, places the fundamental and harmonics of the square wave at the frequencies of the zeros of the decimation filter (if a comb-type filter is used), facilitating removal of the modulated noise.

Any mismatch in sizes of the input capacitors and FET switches (which function as transmission gates) can introduce an input error signal that switches between two random voltage levels as the two pairs of input capacitors perform their alternate signal-sampling function, to cancel this error source, a dynamic element matching technique is used whereby the two capacitors comprising each balanced pair of input capacitors are periodically interchanged. This causes error signals due to a mismatch of the aforementioned type to alternate in polarity so as to cancel out after decimation. This approach, which is similar to that described in U.S. Pat. No. 4,896,156 issued to S. Garverick on Jan. 23, 1990 for "Switched-Capacitance Coupling Networks for Differential-Input Amplifiers not Requiring Balanced Input Signals" and assigned to the instant assignee, is implemented in the double-rate third-order modulator of FIG. 11 in conjunction with the chopping switches 200 of first integrator 31'. The periodic reversal of input capacitors 201a and 201b requires interchanging of their connections at both left-hand and right-hand terminals. At the right-hand terminals, this is done by direct connection to the inputs of operational amplifier 22; i.e., by bypassing DPDT chopping switch 200 at the input side of amplifier 222. The connectivity is equivalent to using additional cross-coupled DPDT switches (wired like chopping switch 200 at the input side of amplifier 222) in series with the right-hand sides of capacitor pairs 201a, 201b and 202a, 202b. the connection employed in the circuit of FIG. 11 has the benefit of not requiring the extra DPDT switches.

On the left-hand side of the input capacitors, periodic reversal is implemented by reversing the polarity of the input signals at capacitors 202a and 202b by logically ANDing the clock $\phi_{24}$ signal with the chopping clock signals $\phi_{CHP}$ or $\phi_{CHN}$ for input clocks $\phi_{INP}$ and $\phi_{INN}$, respectively. In a similar manner, the polarity of the 1-bit DAC 210 signal is periodically reversed in synchronization with the chopping signal $\phi_{CHN}$. This is accomplished by the logical ORing of the $\phi_{CHN}$ clock with the CMP1 and CMP1b signals for $\phi_{DACP1}$ and $\phi_{DACP2}$, respectively, as indicated by the above logical equations.

In this specific implementation, the output signal of operational amplifier 222 is taken directly from the operational amplifier instead of after the chopping DPDT switch 200 coupled to the output of the amplifier. This connection is more favorable for operation at fast clock rates since transients settle faster to this point than after the chopping DPDT switch 200. However, polarity of the amplifier output signal here alternates periodically due to the chopping signals, whereas on the other side of the chopping switch 200 coupled to the output of the amplifier, polarity does not alternate. To compensate for this, input switches 204 to the second integrator 30' also periodically reverse the polarity of the input signal as is done in the first integrator 31'.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

Having thus described my invention, what I claim as new and desire to secure by Letters Patent is as follows:

1. A double-rate oversampled interpolative modulator for analog-to-digital conversion comprising:
    a switched capacitor integrator having at least one input and at least one output;
    analog-to-digital conversion means coupled to the output of said switched capacitor integrator for generating a digital output signal; and
    digital-to-analog conversion means coupled to receive the digital output signal of said analog-to-digital conversion means and to generate a quantized analog voltage proportional to said digital output signal, said switched capacitor integrator including an operational amplifier, a feedback capacitor, and sampling means, said sampling means comprising:
    first and second switch means for alternately sampling an analog input signal and said quantized analog voltage proportional to said digital output signal,
    first and second input capacitors adapted to be alternately charged by said analog input signal and said quantized analog voltage, and
    third and fourth switch means for alternately coupling said first and second capacitors to ground and to an input of said operational amplifier,
    said switch means being operable by predetermined phases of a clock in order to enable said integrator to perform an integration twice per clock cycle so as to double an effective operating rate of the oversampled modulator.

2. The double-rate oversampled interpolative modulator of claim 1 wherein said analog-to-digital conversion means comprises first and second analog-to-digital converters and said digital-to-analog conversion means comprises first and second digital-to-analog converters, the output of said first analog-to-digital converter being coupled to said first digital-to-analog converter and the output of said second analog-to-digital converter being coupled to said second digital-to-analog converter, and further comprising:
    fifth and sixth switch means for alternately coupling the output of said integrator to said first and second analog-to-digital converters; and
    multiplexer means connected to the outputs of said first and second analog-to-digital converters for selecting one of said outputs as the output of said oversampled modulator.

3. The double-rate oversampled interpolative modulator of claim 2 wherein the analog-to-digital converters and digital-to-analog converters each have a quantization level of 1, said first and second analog-to-digital converters each comprise an auto-zeroed comparator, respectively, and said first and second digital-to-analog converters each comprise first and second switched voltage reference sources, respectively.

4. The double-rate oversampled interpolative modulator recited in claim 1 wherein each of said analog-to-digital conversion means and said digital-to-analog conversion means comprises a respective converter for operating twice per clock cycle to perform conversions during said predetermined phases of the clock.

5. The double-rate oversampled interpolative modulator of claim 1 wherein said analog-to-digital conversion means comprises an analog-to-digital converter operable at twice per clock cycle to perform conversions during said predetermined phases of the clock and said digital-to-analog conversion means comprises first and second digital-to-analog converters, said modulator further comprising fifth switch means for alternately coupling an output of said analog-to-digital conversion means to said first and second digital-to-analog converters during a clock cycle.

6. The double-rate oversampled interpolative modulator of claim 1 wherein said switched capacitor integrator includes balanced inputs and balanced outputs, said operational amplifier being a differential amplifier having inverting and noninverting inputs and inverting and noninverting outputs, and said first and second input capacitors each comprise a pair of balanced capacitors.

7. The double-rate oversampled interpolative modulator of claim 6 further comprising chopper means coupled to the inputs and outputs of said differential amplifier for stabilizing operation of said modulator, said chopper means operating at a rate that is an integral multiple rate of an output conversion rate.

8. The double-rate oversampled interpolative modulator of claim 6 further comprising dynamic element matching means for periodically interchanging the two capacitors of each input pair of capacitors, so as to cause errors due to size mismatches to alternate in polarity and cancel.

9. A double-rate second-order oversampled interpolative modulator for analog-to-digital conversion comprising:
first and second switched capacitor integrators each having at least one input and at least one output, an input of said second switched capacitor integrator being coupled to an output of said first switched capacitor integrator;
L-bit analog-to-digital conversion means coupled to the output of said second switched capacitor integrator for generating an L-bit digital output signal; and
L-bit digital-to-analog conversion means coupled to receive said L-bit digital output signal of said L-bit analog-to-digital conversion means and to generate a quantized analog voltage proportional to said L-bit digital output signal, wherein L is the quantization level of said analog-to-digital and digital-to-analog conversion means, each of said first and second switched capacitor integrators includes an operational amplifier, a feedback capacitor, and sampling means, respectively, and each said sampling means comprises:
first and second switch means for alternately sampling an input signal and said quantized analog voltage proportional to said L-bit digital output signal,
first and second input capacitors adapted to be alternately charged by said input signal and said quantized analog voltage, and
third and fourth switch means for alternately coupling said first and second capacitors to ground and to an input of said operational amplifier,
said switch means being operable by predetermined phases of a clock in order to enable the integrator that includes said each sampling means to perform an integration twice per clock cycle so as to double an effective operating rate of the oversampled modulator.

10. The double-rate second-order oversampled interpolative modulator of claim 9 wherein said L-bit analog-to-digital conversion means comprises first and second analog-to-digital converters and said L-bit digital-to-analog conversion means comprises first and second L-bit digital-to-analog converters, the output of said first analog-to-digital converter being coupled to said first digital-to-analog converter and the output of said second analog-to-digital converter being coupled to said second digital-to-analog converter, and further comprising:
fifth switch means for alternately coupling the output of said second switched capacitor integrator to said first and second analog-to-digital converters; and
multiplexer means coupled to the outputs of said first and second analog-to-digital converters for selecting one of the outputs of said analog-to-digital converters as the output of said oversampled modulator.

11. The double-rate second order oversampled interpolative modulator of claim 10 wherein L equals 1, said first and second analog-to-digital converters each comprise an auto-zeroed comparator, respectively, and said first and second digital-to-analog converters each comprise first and second switched voltage reference sources, respectively.

12. The double-rate second-order oversampled interpolative modulator of claim 9 wherein each of said L-bit analog-to-digital conversion means and said L-bit digital-to-analog conversion means comprises a respective converter for operating twice per clock cycle to perform conversions during said predetermined phases of the clock.

13. The double-rate second-order oversampled interpolative modulator of claim 9 wherein said L-bit analog-to-digital conversion means comprises an analog-to-digital converter operable at twice per clock cycle to perform conversions during said predetermined phases of the clock and said L-bit digital-to-analog conversion means comprises first and second L-bit digital-to-analog converters, said modulator further comprising fifth switch means for alternately coupling an output of said analog-to-digital conversion means to said first and second digital-to-analog converters during a clock cycle.

14. The double-rate second-order oversampled interpolative modulator of claim 9 wherein each of said first and second switched capacitor integrators includes balanced inputs and balanced outputs, each of said operational amplifiers being a differential amplifier having inverting and noninverting inputs and inverting and noninverting outputs, and said first and second input capacitors of each of said switched capacitor integrators comprises a pair of balanced capacitors, respectively 15. The double-rate second-order oversampled interpolative modulator of claim 14 further comprising chopper means coupled to the inputs and outputs of the differential amplifier of said first switched capacitor integrator for stabilizing operation of said modulator, said chopper means operating at a rate that is an integral multiple rate of an output conversion rate.

16. The double-rate second-order oversampled interpolative modulator of claim 14 further comprising dynamic element matching means for periodically interchanging the two capacitors of each input pair of capacitors of said first and second switched capacitor integrators, respectively, so as to cause errors due to mismatch to alternate in polarity and cancel.

17. A double-rate third-order oversampled interpolative modulator for analog-to-digital conversion comprising:
first, second and third switched capacitor integrators each having at least one input and at least one output, an input of said second switched capacitor integrator being coupled to an output of said first switched capacitor integrator and an input of said third switched capacitor integrator being coupled to an output of said second switched capacitor integrator;

L-bit analog-to-digital conversion means coupled to the output of said second switched capacitor integrator for generating an L-bit digital output signal;

L-bit digital-to-analog conversion means coupled to receive said L-bit digital output signal of said L-bit analog-to-digital conversion means and to generate a first quantized analog voltage proportional to said L-bit digital output signal;

M-bit analog-to-digital conversion means coupled to the output of said third switched capacitor integrator for generating an M-bit digital output signal;

M-bit digital-to-analog conversion means coupled to receive said M-bit digital output signal of said M-bit analog-to-digital conversion means and to generate a second quantized analog voltage proportional to said M-bit digital output signal, wherein L and M each represents a quantization level of said L-bit analog-to-digital and digital-to-analog conversion means and said M-bit analog-to-digital and digital-to-analog conversion means, respectively, each of said first, second and third switched capacitor integrators includes an operational amplifier, a feedback capacitor, and sampling means, respectively, and each said sampling means comprises:

first and second switch means for alternately sampling an input signal and said first quantized analog voltage, said first and second switch means of said first and second switched capacitor integrators being coupled to sample said first quantized analog voltage and said first and second switch means for said third switched capacitor integrator being coupled to sample said second quantized analog voltage, first and second input capacitors for being charged alternately by said input signal and said first quantized analog voltage, and third and fourth switch means for alternately coupling said first and second capacitors to ground and to an input of said operational amplifier of said first and second switched capacitor integrators, respectively, each of said switch means being operated by a predetermined clock phase, respectively, to enable said switched capacitor integrator in which it is included to perform an integration twice per clock cycle so as to double an effective operating rate of the oversampled modulator; and digital canceler means coupled to receive output signals from said second and third switched capacitor integrators for providing an output signal from said modulator.

18. The double-rate third-order oversampled interpolative modulator of claim 17 wherein said L-bit analog-to-digital conversion means and said M-bit analog-to-digital conversion means each comprises first and second L-bit analog-to-digital converters and first and second M-bit analog-to-digital converters, respectively, said L-bit digital-to-analog conversion means comprises first and second L-bit digital-to-analog converters, the output of said first L-bit analog-to-digital converter being coupled to said first L-bit digital-to-analog converter and the output of said second L-bit analog-to-digital converter being coupled to said second L-bit digital-to-analog converter, and said M-bit digital-to-analog conversion means comprises first and second M-bit digital-to-analog converters, the output of said first M-bit analog-to-digital converter being coupled to said first M-bit digital-to-analog converter and the output of said second M-bit analog-to-digital converter being coupled to said second M-bit digital-to-analog converter, further comprising:

fifth switch means for coupling the output of said second switched capacitor integrator alternately to said first and second L-bit analog-to-digital converters;

first multiplexer means coupled to the outputs of said first and second L-bit analog-to-digital converters for selecting one of the outputs of said L-bit analog-to-digital converters as the output of said second switched capacitor integrator;

sixth switch means for coupling the output of said third switched capacitor integrator alternately to said first and second M-bit analog-to-digital converters; and second multiplexer means coupled to the outputs of said first and second M-bit analog-to-digital converters for selecting one of the outputs of said M-bit analog-to-digital converters as the output of said third switched capacitor integrator.

19. The double-rate third-order oversampled interpolative modulator of claim 18 wherein L equals 1, each of said analog-to-digital converters respectively comprises an auto-zeroed comparator and each of said digital-to-analog converters respectively comprises a switched voltage reference source.

20. The double-rate third-order oversampled interpolative modulator of claim 17 wherein each of said analog-to-digital conversion means and said digital-to-analog conversion means is comprised of converters operating twice per clock cycle to perform analog-to-digital and digital-to-analog conversions on said predetermined clock phases.

21. The double-rate third-order oversampled interpolative modulator of claim 17 wherein each of said L-bit and said M-bit analog-to-digital conversion means respectively comprises first and second analog-to-digital converters operating twice per clock cycle to perform conversions on said predetermined clock phases and each of said L-bit and said M-bit digital-to-analog conversion means respectively comprises first and second digital-to-analog converters, and further comprising:

fifth switch means for coupling the output signal of said second switched capacitor integrator alternately through said first and second analog-to-digital converters of said L-bit analog-to-digital conversion means to said first and second digital-to-analog converters of said L-bit digital-to-analog conversion means during a clock cycle; and sixth switch means for coupling the output signal of said third switched capacitor integrator alternately through said first and second analog-to-digital converters of said M-bit analog-to-digital conversion means to said first and second digital-to-analog converters of said M-bit digital-to-analog conversion means during a clock cycle.

22. The double-rate third-order oversampled interpolative modulator of claim 17 wherein each of said first, second and third switched capacitor integrators includes balanced inputs and balanced outputs, the operational amplifier of each said sampling means comprises a differential amplifier having inverting and noninverting inputs and inverting and noninverting outputs, and the first and second input capacitors of each said sampling means comprise a pair of balanced capacitors.

23. The double-rate third-order oversampled interpolative modulator of claim 22 further comprising chopper means coupled to the inputs and outputs of the differential amplifier of said first switched capacitor integrator for stabilizing operation of said modulator, said chopper means being adapted to operate at a rate that is an integral multiple of an output conversion rate for said modulator.

24. The double-rate third-order oversampled interpolative modulator of claim 23 wherein each respective one of said first, second and third switch capacitor integrators further comprises dynamic circuit element matching means for periodically interchanging the two capacitors of each input pair of capacitors of said first, second and third switched capacitor integrators, respectively, so as to cause errors due to circuit element mismatch to alternate in polarity and thereby cancel.

* * * * *